United States Patent
Augspurger et al.

(10) Patent No.: US 11,609,335 B2
(45) Date of Patent: Mar. 21, 2023

(54) FAN WITH INTEGRATED SENSOR

(71) Applicant: Deutsche Post AG, Bonn (DE)

(72) Inventors: Tobias Augspurger, Aachen (DE); Felix Orth, Aachen (DE); Klaus Ening, Aachen (DE); Bugra Turan, Aachen (DE); Nick Fiege, Aachen (DE)

(73) Assignee: Deutsche Post AG, Bonn (DE)

( * ) Notice: Subject to any disclaimer, the term of this patent is extended or adjusted under 35 U.S.C. 154(b) by 372 days.

(21) Appl. No.: 16/520,834

(22) Filed: Jul. 24, 2019

(65) Prior Publication Data

US 2020/0033480 A1    Jan. 30, 2020

(30) Foreign Application Priority Data

Jul. 25, 2018  (DE) ..................... 10 2018 118 007.1

(51) Int. Cl.
| | |
|---|---|
| *G01S 17/931* | (2020.01) |
| *H05K 7/20* | (2006.01) |
| *G06V 20/56* | (2022.01) |
| *B60R 11/00* | (2006.01) |
| *G05D 1/02* | (2020.01) |

(52) U.S. Cl.
CPC ............ *G01S 17/931* (2020.01); *G06V 20/56* (2022.01); *H05K 7/20136* (2013.01); *B60R 2011/0085* (2013.01); *G05D 1/0231* (2013.01)

(58) Field of Classification Search
CPC .... G01S 17/931; G01S 7/4813; G01S 7/4817; G01S 17/89; G06K 9/00791; H05K 7/20136; H05K 7/20845; H05K 7/20945; B60R 2011/0085; G05D 1/0231; B60H 1/00457; B60H 1/00792; B60H 1/00821; B60H 1/00878
See application file for complete search history.

(56) References Cited

U.S. PATENT DOCUMENTS

| | | | | |
|---|---|---|---|---|
| 9,885,526 | B2 * | 2/2018 | Maranville | .............. F25B 21/02 |
| 11,016,181 | B2 * | 5/2021 | Schwarz | ............... G01S 7/4817 |
| 2010/0149407 | A1 | 6/2010 | Lee et al. | |

(Continued)

FOREIGN PATENT DOCUMENTS

| | | | |
|---|---|---|---|
| DE | 102016201057 A1 * | 7/2017 | ........... G01S 7/4814 |
| DE | 102016201057 A1 | 7/2017 | |

(Continued)

OTHER PUBLICATIONS

Translation of DE102016201057A1 (Year: 2017).*

(Continued)

*Primary Examiner* — Thomas E Worden
*Assistant Examiner* — Daniel Tyler Reich
(74) *Attorney, Agent, or Firm* — Dority & Manning, PA

(57) ABSTRACT

A vehicle includes a rotatably mounted sensor designed to produce an image of an environment of the vehicle, a control device designed to process data obtained from the sensor, and a ventilation device that is designed for cooling the control device by a rotatably mounted impeller. An axis of rotation of the impeller is oriented orthogonally to a direction of movement of the vehicle and the ventilation device and the sensor are rotationally coupled in such a way that the impeller rotates the sensor around the axis of rotation.

18 Claims, 2 Drawing Sheets

(56) References Cited

U.S. PATENT DOCUMENTS

| | | | | |
|---|---|---|---|---|
| 2011/0028224 A1* | 2/2011 | Bushey | ............... | G01M 13/025 |
| | | | | 464/27 |
| 2014/0049912 A1* | 2/2014 | Marshall | ............. | H04B 1/3877 |
| | | | | 361/679.01 |
| 2017/0082092 A1* | 3/2017 | Gaither | .................. | B60K 11/06 |
| 2017/0115396 A1* | 4/2017 | Uehara | ................. | G01S 17/931 |
| 2018/0109061 A1* | 4/2018 | Pardhan | ................... | H02K 9/22 |
| 2018/0113202 A1* | 4/2018 | Ruchatz | ............... | G01S 7/4817 |
| 2018/0113209 A1 | 4/2018 | Campbell | | |
| 2020/0271759 A1* | 8/2020 | Hattass | ................. | H05K 7/202 |

FOREIGN PATENT DOCUMENTS

| | | |
|---|---|---|
| DE | 102017104988 A1 | 9/2017 |
| EP | 3 032 278 | 6/2016 |

OTHER PUBLICATIONS

German Office Action (with English Translation) DE102018118007.1, dated May 16, 2019, (11 pages).

Chinese First Office Action (English translation w/ summary) for corresponding Chinese Application No. 201910662287.7, dated Aug. 17, 2022, 7 pages.

\* cited by examiner

FAN WITH INTEGRATED SENSOR

CROSS-REFERENCE TO RELATED APPLICATION

The present application is related and has right of priority to DE 10 2018 118 007.1, the entirety of which is incorporated by reference for all purposes.

TECHNICAL FIELD

The invention relates generally to a vehicle with a rotatably mounted sensor designed to produce an image of an environment of the vehicle, and a control device designed to process data obtained from the sensor. The invention also relates generally to a method for producing an image of an environment of a vehicle, with turning an impeller of a ventilation device designed to cool a control device of the vehicle.

BACKGROUND OF THE INVENTION

As a result of increasing freight traffic by piece goods and group goods, truck or container transport, sea or air freight parcel transport in the context of e-commerce and online mail order offers, the number of transported goods, and in particular parcel shipments, consignments or other transportable goods, hereinafter referred to as objects, has increased significantly. Although it is now possible to place an order online independently of conventional shop opening hours, the delivery of the object to the recipient is almost exclusively by classic delivery methods, for example by postmen or in the case of parcel shipments by motorized delivery vehicles and essentially only within shop opening hours. If the recipient is not present when the object is delivered, for example because he or she is working as an employee during the delivery times, either an attempt is made to deliver the object again or the object is stored in a branch of the delivery company, in a packing station, in a parcel box, with a neighbor or the like for later collection by the recipient.

In recent times, therefore, attempts have been made to deliver objects to the recipient by unmanned autonomous vehicles or to a specialist facility as a collection point, for example to a packing station that is set up in a public space for a district for a number of recipients or in the front yard of the recipient's house. The object can be removed from or placed in the facility outside store opening times or delivery times.

Autonomous vehicles use sensors, especially lidar sensors, to produce an image of an environment of the vehicle that allows the vehicle to move autonomously along a predetermined or dynamically produced route. Such lidar sensors are a key element for autonomous locomotion, as the sensors provide solid volume data regardless of surrounding lighting conditions. Despite the progressive spread of autonomous vehicles, lidar sensors, especially three-dimensional, 3D, lidar sensors are still costly.

DESCRIPTION OF THE INVENTION

Starting from this situation, it is an example object of the present invention to specify a vehicle with a sensor for producing an image of an environment of the vehicle that can be manufactured more cheaply compared to sensors that are known from the prior art.

Accordingly, the object is achieved by a vehicle with
a rotatably mounted sensor designed to produce an image of an environment of the vehicle,
a control device designed to process data received from the sensor, and
a ventilation device designed to cool the control device with a rotatably mounted impeller, wherein
the ventilation device and the sensor are rotationally coupled in such a way that the impeller rotates the sensor about an axis of rotation.

According to a preferred development, the control device is designed to move the vehicle autonomously, to calculate the image of the environment on the basis of environment data obtained from the sensor and/or to autonomously move the vehicle based on the image produced. The control device can therefore process data obtained from the sensor on the one hand, for example to produce an electronic map of the environment, or in particular to move the vehicle autonomously on the basis of the produced electronic map. In any case, such control and/or computing tasks regularly require high computing power that generates waste heat.

A significant aspect is that the sensor, in particular a lidar sensor, is rotationally coupled to the impeller. Now if a 2D lidar is used as a sensor, the rotational motion coupling causes a three-dimensional image of the vehicle surroundings to be detected. The rotational movement of the impeller that is produced by the ventilation device in any case for cooling the control device is transmitted to the sensor by the rotary motion coupling, so that the sensor rotates around the axis of rotation. Now if for example a 2D lidar sensor that is orthogonally pivoted is provided as a sensor, the three-dimensional image of the vehicle's surroundings can easily be captured by the proposed device, since the 2D lidar sensor can provide three-dimensional volume data of the vehicle's surroundings due to the rotational motion. Since the impellers and lidar sensors of autonomous vehicles often rotate at the same rate of five (5) to ten (10) revolutions per minute, for example, it is recommended to pair the impeller and the sensor with each other in order to transfer the rotational movement of the impeller to the sensor. However, the proposed vehicle is taking a completely new approach, because sensors in the state of the art, especially lidar sensors, and ventilation devices of autonomous vehicles are always designed separately and not exactly in a motion-coupled manner.

The vehicle may be designed in different ways, including a passenger car, a van, a robot cart, a picking cart or a truck. Preferably, the vehicle has a driver's cab, behind which a load space or a load area for transporting objects is disposed. The vehicle is preferably designed as a delivery vehicle for delivering objects, for example, between a logistics center, a warehouse, a repository and/or a distribution center and recipients or senders of the objects. The recipients or senders of the objects may be persons, packing stations and/or the aforementioned logistics centers, warehouses, repositories or distribution centers. In addition to a preferred autonomous driving method, the vehicle can also be moved along a predetermined or self-assembled route as personalized by a delivery driver in order to deliver the objects to and/or to pick up the objects from one or more destinations. In principle, however, the vehicle can preferably autonomously travel a predetermined or assembled route and can stop independently at one or more destinations where an object can be removed from the load space and/or can be placed in the load space.

The load space may be designed as an open loading area with side, front and/or rear doors and/or flaps. Particularly preferably, the load space is completely lockable by the doors against external influences, in particular weather influences, so that unauthorized third parties have no access to the objects transported in the load space. Further preferably, the load space has a cuboid-like volume and/or the load space is provided with a rectangular base area as a loading surface and/or a floor on which the objects can be placed adjacent to each other and/or one on top of the other. The usable volume of the load space can be, for example, ≥four (4), ≥eight (8), or ≥twenty (20) cubic meters ($m^3$), so that objects with a weight of, for example, six-hundred and fifty (650) kg, one-thousand (1000) kg or one-thousand, three-hundred and fifty (1350) kg can be transported as a useful load. The load space preferably includes a rectangular and/or flat usable surface on which the objects are removably, in particular stackably, placed.

The object may be any transportable item, in particular a commodity, general cargo and/or a consignment. The object may include everyday items such as consumables or food, as well as technical items or equipment. Similarly, shipments such as mailings, parcels and/or print products such as leaflets, brochures or magazines may be included. The control device preferably includes a controller and/or computer equipped with software to maneuver the vehicle on the basis of environment data obtained from the sensor. The axis of rotation preferably extends in the direction of the surface normal of the loading surface. The term rotationally coupled means either a rigid connection or a connection in such a way that the sensor can also rotate independently of the impeller, for example can rotate faster than the impeller, but a rotational movement of the impeller is transmitted to the sensor according to a type of "take-along" function. In a preferred further development, the axis of rotation of the impeller is oriented orthogonally to a direction of movement of the vehicle. The control device can be designed to move the vehicle autonomously depending on the image produced. Alternatively or additionally, the control device may be designed such that vehicle moves on the basis of predetermined data, for example on the basis of an electronic map.

Basically, the ventilation device can be designed as desired. According to a preferred further development, the ventilation device is designed as a radial fan. The ventilation device can also be designed as an axial fan. The impeller preferably has scoops or blades to extract waste heat from the control device. The ventilation device is preferably arranged and designed to extract waste heat of the control device and/or to extract waste heat from a driver's cab of the vehicle. Control devices and, if necessary, other systems present in the vehicle for autonomous driving often produce waste heat of more than five-hundred Watts (500 W) due to the high computing power required for autonomous driving, which must be dissipated by the ventilation device for proper operation of the vehicle.

According to a preferred development, the ventilation device is disposed above the control device and connected thereto so that the impeller in particular extracts air from an internal space of the control device. The impeller can also extract external heat from the control device. Preferably, the ventilation device is arranged in contact with and/or adjacently above the control device. Further preferably, the ventilation device is designed to extract air from the cab, which enables air conditioning of the cab to be achieved. Likewise, the ventilation device may be designed to supply air heated by the control device to the cab for heating the cab. Further preferably, the ventilation device is designed to optionally supply air heated by the control device to the cab and/or to extract air from the cab.

According to another preferred development, the sensor, the control device and/or the ventilation device is/are provided at an exposed position on the vehicle. By disposing it in an exposed position, the sensor can detect as wide an environment as possible and thus a wide image of the vehicle's surroundings, so that the control device can detect obstacles at an early stage and/or can produce a map of the environment. In this context, it is further preferred that the sensor, the control device and/or the ventilation device is/are disposed on a roof of the vehicle, in particular on and/or in a roof of a cab of the vehicle, for example under a windshield of the vehicle cab. Particularly preferably, the sensor, the control device and the ventilation device are disposed on top of each other on the roof of the cab and/or a driver's cab of the vehicle. Particularly preferably, the sensor is disposed above the ventilation device, directly adjacent to and/or in one piece therewith.

According to another preferred development, the impeller is propelled by wind and/or by a motor. For driving the impeller by a driving wind, lateral openings can be provided therein, into which the driving wind flows and can thus move the impeller in a rotational motion. An additional motor, if any, may be connected in support and/or when the vehicle is at a standstill in order to ensure a minimum speed of the impeller and thus a minimum cooling performance of the ventilation device. In the case of a battery-powered vehicle, such an embodiment can make the cooling of the control device particularly energy-saving.

According to another preferred development, the impeller and the sensor have a common axis of rotation. Preferably, a coupling is provided on the common axis of rotation, by which a rotational movement of the impeller is transmitted to the sensor, while the sensor can also rotate independently of the impeller. According to an even more preferred development, the ventilation device and the sensor are rotationally coupled by a gearbox. For example, the gearbox has a gear ratio of two to one (2:1) or three to one (3:1). If the impeller requires a higher speed than the sensor to achieve a minimum cooling, this higher speed can be set by the gearbox.

There are basically different options for designing the sensor. According to a particularly preferred development, the sensor is embodied as a lidar sensor. A lidar sensor preferably emits laser pulses and detects back-scattered light from the atmosphere. From a light transition time of the pulses, a distance to the scattering location is calculated and thus the image of the environment is produced. Likewise, the lidar sensor can emit laser pulses and measure a distance to a surface in the environment that is reflecting the laser pulses by a so-called time-of-flight method. Preferably, the sensor is designed as a 2D lidar sensor. Further preferably, the 2D sensor is arranged in such a way that, with a fixed sensor, an image of the vertical can be determined by the 2D sensor as a two-dimensional image of the environment only in the direction of the vertical. By rotating the 2D sensor around the axis of rotation, a three-dimensional image of the vehicle surroundings can be advantageously produced without requiring a much more cost-intensive 3D lidar sensor compared to a 2D lidar sensor and a significantly more complex technical structure.

According to yet another preferred development, the sensor includes a mirror that can be pivoted relative to the horizontal. Preferably, the sensor includes a motor by which the mirror can be pivoted. By pivoting the mirror, an image of the vertical can be produced. By rotating the sensor and thus the mirror around the axis of rotation, which preferably extends in the direction of the vertical in the case of the vehicle not being rotated relative to horizontal, an image of the horizontal can also be produced in order to produce a three-dimensional image of the surroundings of the vehicle.

The object of the invention is also achieved by a method for producing an image of an environment of a vehicle, that includes:

Rotating an impeller of a ventilation device designed to cool a control device of the vehicle, and Driving a sensor coupled to the impeller and designed to produce the image of the vehicle surroundings about an axis of rotation.

According to a preferred development, the procedure includes:

Autonomous movement of the vehicle depending on the image produced by the control device.

The proposed method advantageously enables a three-dimensional image of the environment of the vehicle to be produced, for example by a 2D lidar sensor.

Developments of the method as well as advantages of the method arise similarly to the case of the vehicle described above for the person skilled in the art.

BRIEF DESCRIPTION OF THE DRAWINGS

The invention is explained below in more detail on the basis of preferred exemplary embodiments with reference to the accompanying drawings.

In the figures.

DETAILED DESCRIPTION OF THE EXEMPLARY EMBODIMENTS

Figure 1:
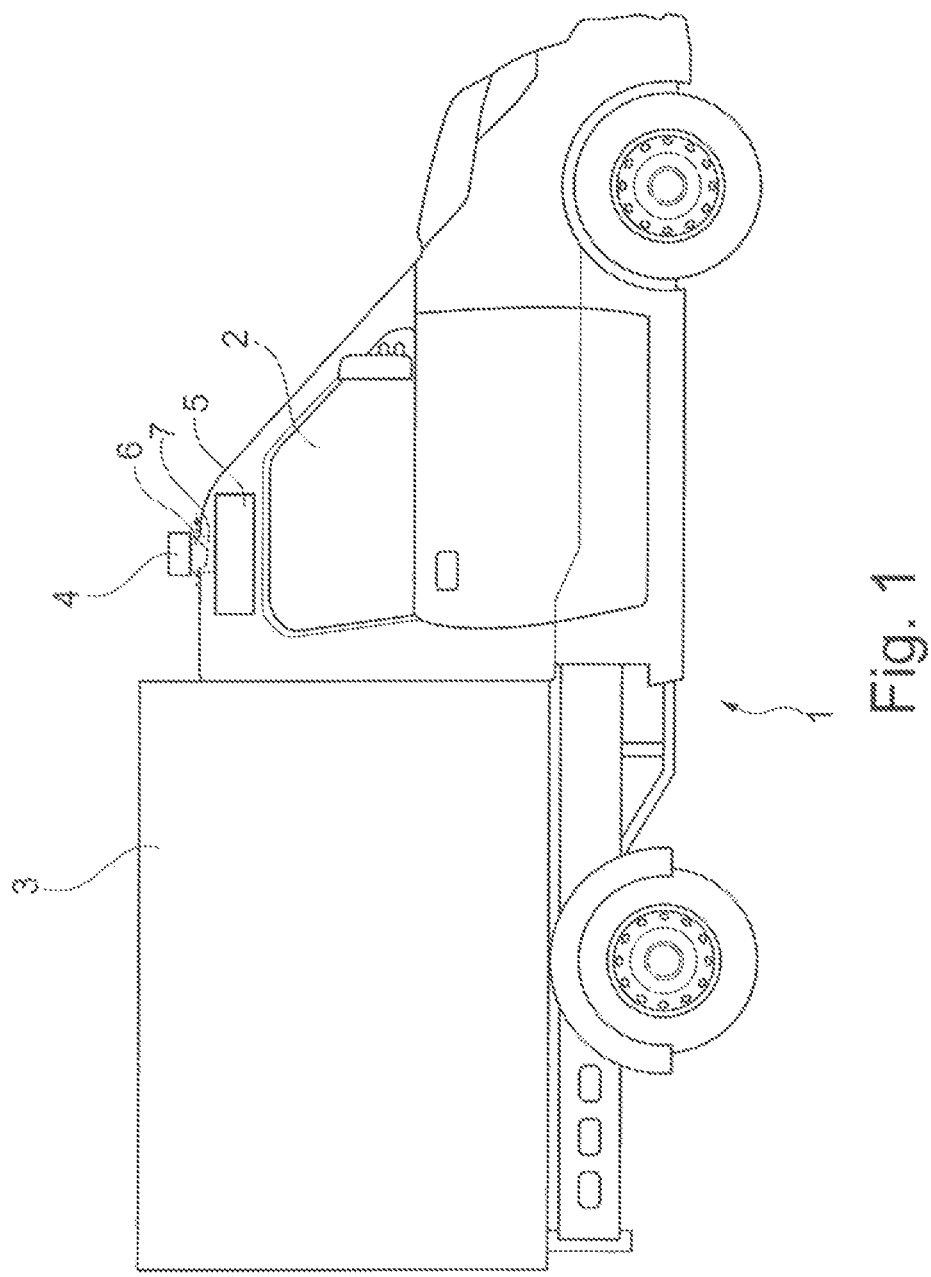
FIG. 1 shows a schematic view of a vehicle according to a preferred exemplary embodiment of the invention in a side view.

Reference will now be made to embodiments of the invention, one or more examples of which are shown in the drawings. Each embodiment is provided by way of explanation of the invention, and not as a limitation of the invention. For example, features illustrated or described as part of one embodiment can be combined with another embodiment to yield still another embodiment. It is intended that the present invention include these and other modifications and variations to the embodiments described herein.

FIG. 1 shows a vehicle 1 according to a preferred exemplary embodiment of the invention in a schematic side view. The vehicle 1 is implemented as a battery-operated van with a cab 2 and a closed load cabin 3 behind it. With the preferably autonomously implemented vehicle 1, objects of different types can be delivered entirely without human interaction, for example between a logistics center and a recipient and/or a sender of the object.

In order to produce an image of an environment of the vehicle 1, the vehicle 1 includes a sensor 4 embodied as a 2D lidar sensor, which is disposed in an exposed position on the vehicle 1, in the present case on a roof of the driver's cab 2, and which is rotatably supported around an axis of rotation that is orthogonal to a loading area and/or the direction of movement of the vehicle 1. The sensor 4 thus has an all-round view only limited at the rear by the load cabin 3. The lidar sensor 4 emits laser pulses and uses a time-of-flight method to measure a distance to a surface in the environment that is reflecting the laser pulses in order to produce the image of the environment.

The vehicle 1 also includes a computer-based control device 5 that is designed to move the vehicle 1 autonomously along a defined or dynamically determined route based on the image obtained by the sensor 4. The control device 5 may include additional electrical components for autonomous control of the vehicle 1. The control device 5 is also disposed on the roof of the driver's cab 2.

Figure 2:
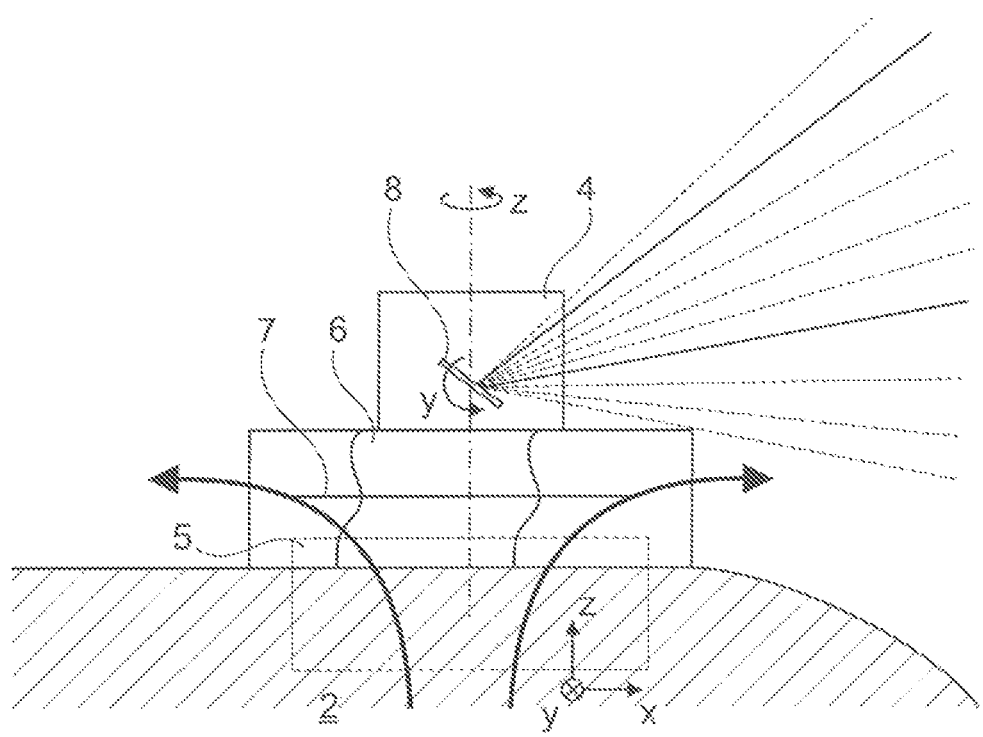
FIG. 2 shows a section of the vehicle according to FIG. 1.

In order to dissipate waste heat of the control device 5 of not infrequently more than five-hundred Watts (500 W), a ventilation device 6 is provided in the form of a radial fan, which has a rotatably mounted impeller 7, indicated in FIG. 1. An axis of rotation of the impeller 7 is oriented orthogonally to the loading surface or the direction of movement of the vehicle 1. The control device 5 is disposed in direct contact on the roof of the driver's cab 2, so that waste heat from an interior space of the control device 5 can be extracted by the impeller 7, as indicated by an arrow. First, the ventilation device 6 is disposed in contact with the control device 5 and spaced apart from the roof, and then the sensor 4 is disposed at the highest point above the roof. FIG. 2 shows the arrangement of the roof of the driver's cab 2, the control device 5, the ventilation device 6 with the impeller 7 and the sensor 4 in detail.

The sensor 4 and the impeller 7 are rotationally coupled in such a way that the impeller 7 rotates the sensor 4 around the axis of rotation. For this purpose, the sensor 4 and the impeller 7 have a rotationally coupled common axis such that on the one hand the impeller 7, when driven by driving wind or by a motor provided within the ventilation device 6, transmits a rotational movement of the impeller 7 to the sensor 4. The axis of rotation of the impeller 7 and the sensor axis of rotation of the sensor 4 coincide and are rotationally coupled by two intermeshing shafts and/or by a gearbox.

Similarly, the sensor 4 may have a dedicated motor to rotate the sensor 4 around the sensor axis of rotation. Since the sensor 4 can be rotated in this way by the impeller 7, the proposed solution makes it easy to upgrade a 2D lidar 4 to a 3D lidar 4: due to the rotational movement transmitted from the impeller 7 to the sensor 4, the sensor 4 rotates around the sensor axis of rotation. Now if for example a 2D lidar 4 is disposed orthogonally pivoted on the ventilation device 6, which would only capture a two-dimensional image of a plane parallel to the vertical without rotational movement by a mirror 8 mounted on the sensor 4 and pivotable relative to the horizontal, a three-dimensional image of the environment can be captured by the 2D lidar 4 because of the rotational movement transferred by the impeller to the sensor 4 due to the rotational coupling. Referring to FIG. 2, on the one hand due to the rotational coupling the mirror 8 is rotated around the sensor axis of rotation, which is referred to as the Z axis in FIG. 2, and on the other hand is pivoted around the Y axis by a motor of the sensor 4.

The exemplary embodiments described are only examples, which can be modified and/or supplemented in various ways within the scope of the claims. Any feature described for a particular exemplary embodiment can be used independently or in combination with other features in any other exemplary embodiment. Any feature that has been described for an exemplary embodiment of a particular category can also be used in an exemplary embodiment of another category.

Modifications and variations can be made to the embodiments illustrated or described herein without departing from the scope and spirit of the invention as set forth in the appended claims.

REFERENCE CHARACTER LIST

Vehicle 1
Driver's cab 2
Load cabin 3
Sensor 4
Control device 5
Ventilation device 6
Impeller 7
Mirror 8

The invention claimed is:

1. A vehicle, comprising:
a rotatable sensor configured to produce an image of an environment around the vehicle;
a control device positioned outside of a housing of the rotatable sensor and configured to process data received from the rotatable sensor, the control device further configured to autonomously move the vehicle, calculate the image of the environment based on ambient data obtained from the rotatable sensor, or autonomously move the vehicle based on the image from the rotatable sensor; and
a ventilation device positioned outside of the housing of the rotatable sensor and configured to cool the control device with a rotatably mounted impeller,
wherein the ventilation device and the rotatable sensor are rotationally coupled such that the rotatably mounted impeller rotates the rotatable sensor around an axis of rotation,
wherein the rotatably mounted impeller is positioned proximate the control device such that the rotatably mounted impeller extracts waste heat generated by the control device by extracting air from an interior space of the control device to an exterior space of the control device when the control device autonomously moves the vehicle, calculates the image of the environment based on ambient data obtained from the rotatable sensor, or autonomously moves the vehicle based on the image from the rotatable sensor, and
wherein one or more of the rotatable sensor, the control device, and the ventilation device is provided at an external location on the vehicle.

2. The vehicle of claim 1, wherein the control device is configured to move the vehicle autonomously, to calculate the image of the environment on the basis of ambient data obtained from the rotatable sensor, and to move the vehicle autonomously depending on the image from the rotatable sensor.

3. The vehicle of claim 1, wherein the axis of rotation of the rotatably mounted impeller is oriented orthogonally to a direction of movement of the vehicle.

4. The vehicle of claim 1, wherein the ventilation device is a radial fan.

5. The vehicle of claim 1, wherein the ventilation device is disposed above the control device and is connected to the control device such that the rotatably mounted impeller is configured to extract the air from the interior space of the control device.

6. The vehicle of claim 1, wherein one or more of the rotatable sensor, the control device and the ventilation device is disposed on a roof of the vehicle.

7. The vehicle of claim 1, wherein the rotatable sensor, the control device and the ventilation device are disposed on a roof of a driver cab of the vehicle.

8. The vehicle of claim 1, wherein the rotatable sensor is disposed above the ventilation device.

9. The vehicle of claim 1, wherein the rotatably mounted impeller is propelled by one or both of a driving wind and a motor.

10. The vehicle of claim 1, wherein the rotatably mounted impeller and the rotatable sensor have a common axis of rotation.

11. The vehicle of claim 1, wherein the ventilation device and the rotatable sensor are rotationally coupled by a gearbox.

12. The vehicle of claim 1, wherein the rotatable sensor is a lidar sensor.

13. The vehicle of claim 1, wherein the rotatable sensor comprises a mirror that is pivotable relative to horizontal.

14. The vehicle of claim 1, wherein the rotatably mounted impeller is propellable by a driving wind.

15. A method for producing an image of an environment around a vehicle, comprising:
turning an impeller of a ventilation device configured to cool a control device of the vehicle;
rotating a sensor about an axis of rotation, the sensor rotationally coupled to the impeller and configured to produce the image of the environment around a vehicle; and
wherein, during the turning of the impeller, the impeller extracts waste heat generated by the control device by extracting air from an interior space of the control device to an exterior space of the control device when the control device autonomously moves the vehicle, calculates the image of the environment around the vehicle based on ambient data obtained from the sensor, or autonomously moves the vehicle based on the image from the sensor, and
wherein the ventilation device and the control device are positioned outside of a housing of the sensor, and one or more of the sensor, the control device, and the ventilation device is provided at an external location on the vehicle.

16. The method of claim 15, further comprising autonomously moving the vehicle with the control device depending on the image produced by the sensor.

17. The method of claim 15, further comprising:
calculating the image of the environment on the basis of ambient data obtained from the sensor; and
moving the vehicle autonomously depending on the image produced by the sensor.

18. The method of claim 15, wherein the turning of the rotatably mounted impeller is propelled by a driving wind.

* * * * *